United States Patent
Nause et al.

(10) Patent No.: US 7,525,128 B2
(45) Date of Patent: Apr. 28, 2009

(54) ZINC-OXIDE-BASED DOUBLE-HETEROSTRUCTURE LIGHT-EMITTING DIODE

(75) Inventors: Jeffrey E. Nause, Mableton, GA (US); Shanthi Ganesan, Smyrna, GA (US)

(73) Assignee: Cermet, Inc., Atlanta, GA (US)

( * ) Notice: Subject to any disclaimer, the term of this patent is extended or adjusted under 35 U.S.C. 154(b) by 152 days.

(21) Appl. No.: 11/618,460

(22) Filed: Dec. 29, 2006

(65) Prior Publication Data

US 2007/0102723 A1 May 10, 2007

Related U.S. Application Data

(63) Continuation of application No. 11/129,064, filed on May 13, 2005, now abandoned.

(51) Int. Cl.
*H01L 29/12* (2006.01)
(52) U.S. Cl. ............ 257/102; 257/E33.02; 257/E33.021
(58) Field of Classification Search ............... 257/102, 257/E33.02, E33.021
See application file for complete search history.

(56) References Cited

U.S. PATENT DOCUMENTS

| 5,574,296 | A | 11/1996 | Park et al. | |
| 6,206,962 | B1* | 3/2001 | Kijima et al. | 117/108 |
| 6,291,085 | B1 | 9/2001 | White et al. | |
| 2002/0025594 | A1 | 2/2002 | Iwata et al. | |
| 2002/0055003 | A1 | 5/2002 | White et al. | |
| 2003/0132449 | A1 | 7/2003 | Hosono et al. | |
| 2004/0099876 | A1 | 5/2004 | Niki et al. | |
| 2004/0235212 | A1 | 11/2004 | Ishizaki | |

FOREIGN PATENT DOCUMENTS

| WO | WO 200108229 A1 | 2/2001 |
| WO | WO 03/030273 | 4/2003 |

OTHER PUBLICATIONS

M. Hiramatsu, K. Imaeda, N. Horio, and M. Nawata, "Transparent conducting ZnO thin films prepared by XeCl excimer laser ablation", J. Vac. Sci. Technol. A 16(2) (1998), pp. 669-673.
K. Minegishi, Y. Koiwai, Y. Kikuchi, and K. Yano, "Growth of p-type Zinc Oxide Films by Chemical Vapor Deposition", Jpn. J. Appl. Phys. vol. 36 Pt. 2, No. 11A (1997), pp. L1453-L1455.

* cited by examiner

*Primary Examiner*—Thomas L Dickey
(74) *Attorney, Agent, or Firm*—Alston & Bird LLP

(57) ABSTRACT

A light-emitting zinc oxide based compound semiconductor device of a double-heterostructure. The double-heterostructure includes a light-emitting layer formed of a low-resistivity $Mg_{1-x-y}Cd_xZn_yO$; $0 \leq x<1$, $0<y \leq 1$, and x+y=0.1 to 1 compound semiconductor doped with p-type and/or n-type impurity. A first clad layer is joined to one surface of the light-emitting layer and formed of an n-type zinc oxide compound semiconductor having a composition different from the light-emitting layer. A second clad layer is joined to another surface of the light-emitting layer and formed of a low-resistivity, p-type zinc oxide based semiconductor having a composition different from the light-emitting layer.

31 Claims, 1 Drawing Sheet

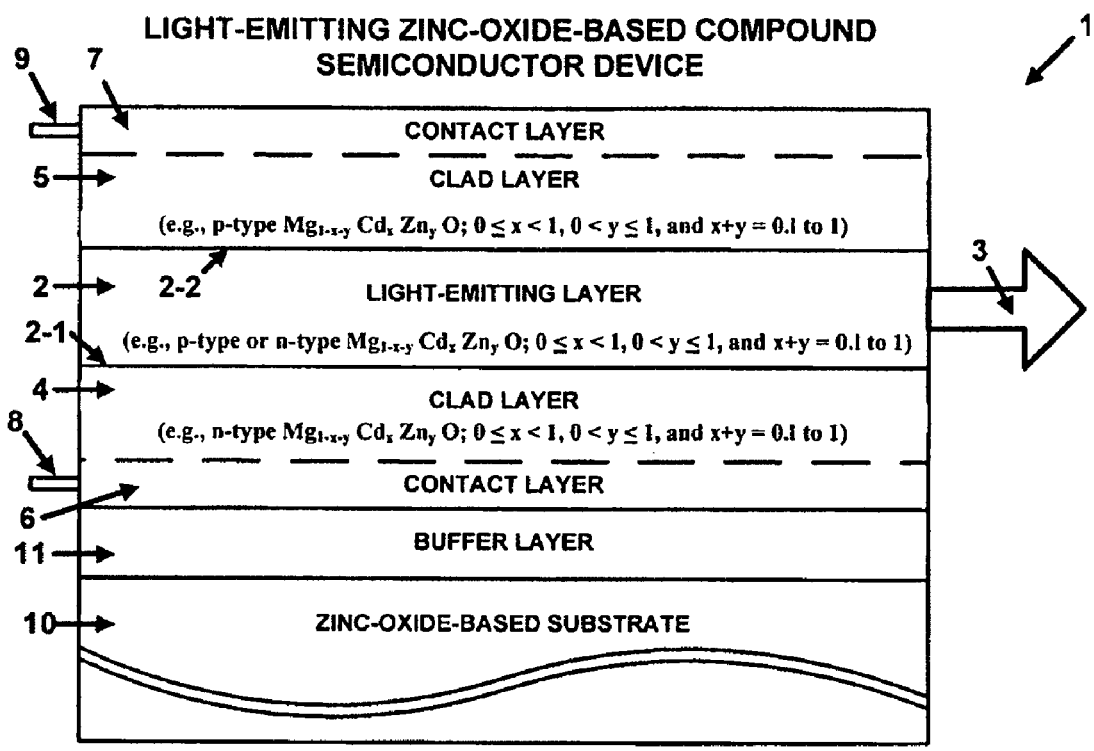

ZINC-OXIDE-BASED DOUBLE-HETEROSTRUCTURE LIGHT-EMITTING DIODE

CROSS-REFERENCE TO RELATED APPLICATIONS

This application is a Continuation of U.S. application Ser. No. 11/129,064, filed May 13, 2005, which claims priority to U.S. Provisional Application No. 60/571,240 filed May 14, 2004, naming Jeffrey E. Nause and Shanthi Ganesan as inventors, which applications are herein incorporated by reference as if set forth in full hereinafter. Both the subject continuation application, non-provisional application and its provisional application have been or are under obligation to be assigned to the same entity.

BACKGROUND OF THE INVENTION

1. Field of the Invention

The present invention relates to a light-emitting zinc-oxide-based compound semiconductor device and, more particularly, to a light-emitting compound semiconductor device having a double heterostructure that is capable of emitting high-power visible light ranging from ultraviolet to red, as desired, by changing the composition of a compound semiconductor constituting an active light-emitting layer.

2. Description of the Related Art

For some time, there has been interest in producing II-VI compound wide band gap semiconductors to produce green/blue light-emitting diodes (LEDs), laser diodes (LDs) and other electrical devices. Historically, attempts to produce these devices have centered around zinc selenide (ZnSe) or gallium nitride (GaN) based technologies. However, these approaches have not been entirely satisfactory due to the short lifetime of light emission that results from defects, and defect migration in these devices.

Recently, because zinc oxide (ZnO) has a wide direct bandgap of 3.3 electron-Volts (eV) at room temperature and provides a strong emission source of ultraviolet light, ZnO thin films on suitable supporting substrates have been proposed as new materials for LEDs and LDs. Undoped, as well as doped, ZnO films generally show n-type conduction. Impurities such as aluminum and gallium in ZnO films have been studied by Hiramatsu et al. who report activity as n-type donors (Transparent Conduction Zinc Oxide Thin Films Prepared by XeCl Excimer Laser Ablation, J. Vac. Sci. Technol. A 16(2), March/April 1998). Although n-type ZnO films have been available for some time, the growth of p-type ZnO films necessary to build many electrical devices requiring p-n junctions has been much slower in developing.

Minegishi et al. (Growth of P-Type ZnO Films by Chemical Vapor Deposition, Jpn. J. Appl. Phys. Vol. 36 Pt. 2, No. 11A (1997)) recently reported on the growth of nitrogen doped ZnO films by chemical vapor deposition and on the p-type conduction of ZnO films at room temperature. Minegishi et al. disclose the growth of p-type ZnO films on a sapphire substrate by the simultaneous addition of ammonia ($NH_3$) in carrier hydrogen and excess Zn in source ZnO powder. When a Zn/ZnO ratio of 10 mol % was used, secondary ion mass spectrometry (SIMS) confirmed the incorporation of nitrogen into the ZnO film, although the nitrogen concentration was not precisely confirmed. Although the films prepared by Minegishi et al. using a Zn/ZnO ratio of 10 mol % appear to incorporate a small amount of nitrogen into the ZnO film and convert the conduction to p-type, the resistivity of these films is too high for application in devices such as LEDs or LDs. Also, Minegishi et al. report that the carrier density for the holes is $1.5 \times 10^{16}$ holes per cubic centimeter (holes/$cm^3$), which is considered to be too low for use in commercial LEDs or LDs.

Park et al. in U.S. Pat. No. 5,574,296 disclose a method of producing thin films on substrates by doping IIB-VIA semiconductors with group VA free radicals for use in electromagnetic radiation transducers. Specifically, Park et al. describe ZnSe epitaxial thin films doped with nitrogen or oxygen wherein ZnSe thin layers are grown on a GaAs substrate by molecular beam epitaxy. The doping of nitrogen or oxygen is accomplished through the use of free radical source which is incorporated into the molecular beam epitaxy system. Using nitrogen as the p-type dopant, net acceptor densities up to $4.9 \times 10^{17}$ acceptors per cubic centimeter (acceptors/$cm^3$) and resistivities less than 15 ohm-cm were measured in the ZeSe film. However, the net acceptor density is too low and the resistivity is too high for use in commercial devices such as LEDs, LDs, and field-effect transistors (FETs).

White et al in U.S. Pat. No. 6,291,085 disclose a method for producing ZnO films containing p-type dopants, in which the p-type dopant is arsenic and the substrate is gallium arsenide (GaAs). The method of preparation of the film is laser ablation. However, the crystal quality of the films prepared by such a process is inferior and not suitable for device applications.

Hideo et al in US Patent Publication No. 20030132449 disclose a method for developing an ultraviolet-light-emitting semiconductor diode comprising an n-type ZnO layer with luminous characteristics formed on a transparent substrate, and a p-type semiconductor layer selected from the group consisting of strontium copper oxide ($SrCu_2O_2$), copper aluminum oxide ($CuAlO_2$) and copper gallium oxide ($CuGaO_2$), which is formed on the n-type ZnO layer to provide a p-n junction therebetween. However, device reliability of these hetero structures is less than desired.

Although some progress has recently been made in the fabrication of p-type doped ZnO films which can be utilized in the formation of p-n junctions, a need still exists in the industry for ZnO films which contain higher optical output and produce a reliable device.

SUMMARY OF THE INVENTION

This invention, in one or more of its several embodiments, overcomes the disadvantages of the above-described previous devices.

In various embodiments of the invention, a light-emitting zinc oxide-based compound semiconductor device having a double-heterostructure comprises a light-emitting layer, a first clad layer, and a second clad layer. The light-emitting layer has first and second major surfaces and is formed of a low-resistivity $Mg_{1-x-y}Cd_xZn_yO$; $0 \leq x < 1$, $0 < y \leq 1$, and $x+y=0.1$ to 1, compound semiconductor doped with an impurity. In some embodiments, the formula is further constrained by $0 < x < 0.5$. In various embodiments, the compound semiconductor of the light-emitting layer can be n-type or p-type conductivity, and can be doped with n-type or p-type impurities, or both. P-type impurity can be a Group V element such as phosphorus, nitrogen, arsenic, or combinations of the foregoing. For example, the p-type impurity doped in the compound semiconductor of the light-emitting layer can comprise phosphorus at a concentration of $1 \times 10^{17}$ to $1 \times 10^{21}$ atoms per cubic centimeter. N-type impurity can be a Group III element such as aluminum, gallium, or combinations of the foregoing. For example, gallium can be used in a concentration of $1 \times 10^{17}$ to $1 \times 10^{21}$ atoms per cubic centimeter. The light-emitting layer can have an electron carrier concentration of $1\times10^{17}$ to $5\times10^{21}$ atoms per cubic centimeter. The first clad layer is joined to the first major surface of the light-emitting layer and is formed of an n-type zinc-based compound semiconductor having a composition different from that of the compound semiconductor of the light-emitting layer. The second clad layer joined to the second major surface of the light-emitting layer and is formed of a low-resistivity p-type zinc oxide-based compound semiconductor having a composition different from that of the compound semiconductor of the light-emitting layer. Like the light-emitting layer, either or both of the first and second clad layers can be represented by the formula $Mg_{1-x-y}Cd_xZn_yO$; $0\leq x<1$, $0<y\leq 1$, and $x+y=0.1$ to 1. Alternatively, the composition of either or both of the first and second clad layers may be different from the light-emitting layer, as represented by the formula: $Mg_{1-n-m}Cd_nZn_mO$; $0\leq n<1$, $0<m\leq 1$, and $n+m=0.1$ to 1. The thickness of one or more of the light-emitting layer, first clad layer, and second clad layer can be 1 to 500 nanometers. For example, the p-type impurity doped in the compound semiconductor of the second clad layer can be nitrogen at a concentration of $1\times10^{17}$ to $1\times10^{21}$ atoms per cubic centimeter, or phosphorus at a concentration of $1\times10^{17}$ to $1\times10^{21}$ atoms per cubic centimeter, or a combination of the same. The second clad layer can have a thickness of 50 to 1,500 nanometers. Moreover, the double heterostructure can comprise an n-type ZnO contact layer joined to the first clad layer, and a p-type ZnO contact layer joined to the second clad layer. The double-heterostructure can further comprise a buffer layer provided on the substrate, upon which the double-heterostructure is situated. The double heterostructure can further comprise an n-type ZnO contact layer joined to the first clad layer, and a p-type ZnO contact layer joined to the second clad layer.

BRIEF DESCRIPTION OF THE DRAWINGS

Having thus described the invention in general terms, reference will now be made to the accompany drawing, forming a part hereof, wherein the elements shown are not necessarily shown to scale, and wherein:

FIG. 1 is a cross-sectional view of light-emitting zinc oxide-based compound semiconductor device having a double-heterostructure in accordance with the invention.

DESCRIPTION OF THE PREFERRED EMBODIMENTS

The present inventions now will be described more fully hereinafter with reference to the accompanying drawing, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 1 is a cross-sectional view of a light-emitting zinc oxide-based compound semiconductor device 1 in accordance with the invention. The device 1 has a double-heterostructure configuration comprising a light-emitting layer 2 for generating light 3, a first clad layer 4, and a second clad layer 5. The light-emitting layer 2 has first and second major surfaces 2-1, 2-2 and is formed of a low-resistivity $Mg_{1-x-y}Cd_xZn_yO$; $0\leq x<1$, $0<y\leq 1$, and $x+y=0.1$ to 1 compound semiconductor doped with an impurity. In some embodiments, the formula is further constrained by $0<x<0.5$. Depending upon species and concentration of impurity atoms, the light-emitting layer 2 can emit light 3 at wavelengths from red to ultraviolet, and is thus highly versatile. Because the light-emitting layer 2 is a zinc-oxide-based material with a relatively wide intrinsic bandgap of 3.3 eV, the light-emitting layer 2 can emit at shorter wavelengths than possible with most materials in commercial use at present. The particular wavelength of the light 3 generated by the light-emitting layer 2 can be adjusted by varying the species, concentration, or both, of the impurity used to dope the light-emitting layer 2. In general, the greater the impurity concentration, the lower the bandgap of the doped layer 2 will be from its intrinsic value of 3.3 eV. Conversely, the less impurity that is present in the light-emitting layer 2, the closer the material will be to its intrinsic value of 3.3 eV.

The compound semiconductor of the light-emitting layer 2 can be n-type or p-type conductivity. The light-emitting layer 2 can be doped with n-type or p-type impurities, or both. P-type impurity can be a Group V element such as phosphorus (P), nitrogen (N), arsenic (As), or combinations of the foregoing. For example, the n-type impurity doped in the compound semiconductor of the light-emitting layer can comprise phosphorus at a concentration of $1\times10^{17}$ to $1\times10^{21}$ atoms per cubic centimeter. N-type impurity can be a Group III element such as aluminum, gallium, or combinations of the foregoing. For example, gallium (Ga) can be used in a concentration of $1\times10^{17}$ to $1\times10^{21}$ atoms per cubic centimeter. Depending upon impurity species and concentration, among other factors such as defects, the light-emitting layer can have an electron carrier concentration of $1\times10^{17}$ to $5\times10^{21}$ atoms per cubic centimeter. The light-emitting layer 2 can have a thickness of 1 to 500 nanometers, for example.

The first clad layer 4 is joined to the first major surface 2-1 of the light-emitting layer 2 and is formed of an n-type zinc-based compound semiconductor having a composition different from that of the compound semiconductor of the light-emitting layer 2. Because it is of the same general chemical composition, zinc oxide, as the light-emitting layer 2, strain between the layers 2, 3 is reduced sufficiently to produce a commercially viable device 1. The first clad layer 3 is formed with a refractive index that is greater than that of the light-emitting layer 2 in order to guide the light 3 to the exit aperture of the device 1. In addition, the first clad layer 3 forms an electrical interface to the first major surface 2-1 of the light-emitting layer 2. N-type impurity can be a Group III element such as aluminum, gallium, or combinations of the foregoing. For example, the n-type impurity doped in the compound semiconductor of the light-emitting layer can comprise phosphorus at a concentration of $1\times10^{17}$ to $1\times10^{21}$ atoms per cubic centimeter. The first clad layer 3 can have a thickness of 1 to 500 nanometers, for example.

The second clad layer 5 is joined to the second major surface 2-2 of the light-emitting layer 2 and is formed of a low-resistivity p-type zinc oxide-based compound semiconductor having a composition different from that of the compound semiconductor of the light-emitting layer 2. The second clad layer 5 can be formed with a refractive index that is sufficiently greater than that of the light-emitting layer 2 to constrain light 3 to travel within the layer 2 so that it is emitted with sufficient intensity. In addition, the second clad layer 5 can provide electrical energy to the light-emitting layer 2 to enable it to emit light 3 through conversion of the electrical energy to optical energy in the active layer 2. P-type impurity can be a Group V element such as phosphorus (P), nitrogen (N), arsenic (As), or combinations of the foregoing. For example, the p-type impurity doped in the compound semiconductor of the second clad layer 5 can be nitrogen at a concentration of $1\times10^{17}$ to $1\times10^{21}$ atoms per cubic centimeter, or phosphorus at a concentration of $1 \times 10^{17}$ to $1 \times 10^{21}$ atoms per cubic centimeter, or a combination of the same. The second clad layer 5 can have a thickness of 50 to 1,500 nanometers.

Like the light-emitting layer 2, either or both of the first and second clad layers 4, 5 can be represented by the formula $Mg_{1-x-y}Cd_xZn_yO$; $0 \leq x < 1$, $0 < y \leq 1$, and $x+y=0.1$ to 1 (x and y being variables representing numbers). Alternatively, the composition of either or both of the first and second clad layers 4, 5 may be different from the light-emitting layer 2, as represented by the formula: $Mg_{1-n-m}Cd_nZn_mO$; $0 \leq n < 1$, $0 < m \leq 1$, and $n+m=0.1$ to 1 (n and m being variables representing numbers different than x and y, respectively).

To provide electrical energy for the light-emitting layer 2 to be able to generate the light 3, the first clad layer 4 can be joined to a contact layer 6 and the second clad layer 5 can be joined to a contact layer 7. The contact layers 5, 6 can have similar chemical compositions to respective clad layers 4, 5 but with a higher concentration of n-type or p-type impurity, respectively, to form an effective electrical connection to respective clad layers 4, 5, and thereby also the light-emitting layer 2. The contact layers 5, 6 can also have metal atoms such as aluminum, copper, silver, gold, nickel, palladium, platinum or combinations these elements in order to provide a good electrical connection to conductors 8, 9. In thickness, the contact layers 5, 6 can be 1 to 500 nanometers in thickness, for example. The conductors 8, 9 make electrical contact with contact layers 7, 8 and are electrically connected to respective terminals of an electrical power source to provide the electrical energy needed for the device 1 to generate the light 3. The conductors 8, 9 can be composed of conductive materials such as aluminum, copper, silver, gold, nickel, palladium, platinum or combinations these elements. The conductors 8, 9 can be welded or sintered to the contact layers 5, 6, for example.

The double-heterostructure device 1 can further comprise a buffer layer 11 provided on the substrate 10, upon which the double-heterostructure is situated. The buffer layer 11 can be composed of a zinc oxide layer of relatively high crystallinity to provide a good foundation upon which to form the various layers of the device 1. The substrate 10 can be formed of zinc oxide in order to provide a lattice matched to that of the overlying layers. In addition, the substrate 10 can be relatively thick, for example, on the order of hundreds of microns to millimeters in thickness, to provide sufficient structural strength for the device and to permit it to be handled by human or machine. The substrate 10 is illustrated in FIG. 1 with wavy lines signifying a continuum so that the substrate 10 is generally much thicker than the other layers 2, 4, 5, 6, 7, 11 of the device 1.

EXAMPLE 1

Cleaning of Substrate 10:

First, a zinc oxide (ZnO) substrate 10 sufficiently washed was mounted on a susceptor in a metal-organic chemical vapor deposition (MOCVD) reaction vessel, and the atmosphere in the reaction vessel was sufficiently substituted with argon (Ar). Subsequently, while argon was flown into the reaction vessel, the substrate 10 was heated to 500° C., and this temperature was held for 20 minutes, thereby cleaning the ZnO substrate.

Growth of First Clad Layer 4:

While the substrate temperature was kept at 500° C., the flow rate of diethyl zinc (DeZn or $Zn(C_2H_5)_2$) was switched to $83.89 \times 10^{-6}$ mole per minute (mol/min), oxygen was introduced at a flow rate of 300 standard cubic centimeters per minute (sccm), and each material gas was supplied for 30 minutes. This step resulted in a first clad layer 4 comprising n-type zinc oxide.

Growth of Light-Emitting Layer 2:

While the substrate temperature was kept at 500° C., and carrier gas at a flow rate of 4000 sccm, and DeZn as a zinc source $83.89 \times 10^{-6}$ mol/min, oxygen gas from oxygen source at a rate of 300 sccm, and ammonia ($NH_3$) as a nitrogen a p-type impurity source, were supplied at flow rates of 5-15 sccm. Thus, a p-type ZnO layer 2, doped with N at a concentration of $1 \times 10^{20}/cm^3$ having a thickness of 40 nanometers was grown on the first clad layer.

Growth of Second Clad Layer 5:

After the light-emitting layer was formed, the substrate was maintained at 500° C. while flowing all gases including ammonia. The zinc-to-oxygen ratio was varied as compared to the first clad layer 4. The flow of DeZn was maintained at $83.89 \times 10^{-6}$ mol/min, but oxygen flow was increased to 400 sccm. This step resulted in a second clad layer 5 comprising p-type zinc oxide.

Conversion into Low-Resistivity Layer:

After the second clad layer 5 was grown, the wafer was taken out of the reaction vessel. The wafer was annealed under oxygen at a temperature of 600° C. or more for 20 minutes. Thus, the second clad layer 5 and the light-emitting layer 2 were converted into low-resistivity layers.

Fabrication of LED:

The second clad layer 5 and the light-emitting layer 2 of the wafer obtained above were partially etched away to expose the first clad layer 4. An ohmic n-electrode 6 was formed on the exposed surface while an ohmic p-electrode 7 was formed on the second clad layer 5. The wafer was cut into chips each having a size of 500 $\mu m^2$, and a light-emitting diode was fabricated by a conventional method.

The light-emitting diode device 1 obtained above had an emission wavelength of 380 nm for the light 3 generated by the device.

EXAMPLE 2

Cleaning of a substrate 10 as performed following the same procedures as in Example 1. The first clad layer 4 was grown using the same procedure as example 1

Growth of Light-Emitting Layer 2:

While the substrate temperature was kept at 500° C., and carrier gas at a flow rate of 4000 sccm, and DeZn as a zinc source $83.89 \times 10^{-6}$ mol/min, cadmium acetyl acetonate as a source of cadmium at a flow rate of $12.02 \times 10^{-6}$ mol/min, oxygen gas from an oxygen source at a rate of 300 sccm, and ammonia for nitrogen as a p-type impurity source, were supplied into the reaction vessel at flow rates of 5-15 sccm. Thus, a p-type CdZnO layer 2, doped with N at a concentration of $1 \times 10^{20}$ atoms/$cm^3$ having a thickness of 40 nanometers was grown on the first clad layer 4.

The second clad layer 5, the annealing treatment and fabrication of a diode device 1 from the wafer were performed following the same procedures as in Example 1, to prepare a light-emitting diode device 1.

EXAMPLE 3

A light-emitting diode device 1 was prepared following the same procedures as in Example 2 except that, in the growth process of a light-emitting layer 2, diethyl cadmium was used as the cadmium source instead of, cadmium acetyl acetonate.

EXAMPLE 4

A light-emitting diode device 1 was prepared following the same procedures as in Example 1 except that, in the growth process of a light-emitting layer 2, gallium was introduced as a n-type impurity with a concentration of $1 \times 10^{17}$ atoms/cm$^3$ to produce a p-type $Cd_{0.15}Zn_{0.85}O$ light-emitting layer 2.

EXAMPLE 5

A homojunction ZnO light-emitting diode device 1 was prepared following the same procedures as in Example 1 except that no light-emitting CdZnO layer was grown.

EXAMPLE 6

Cleaning of a substrate 10 was performed following the same procedures as in Example 1.

The first clad layer 4 was grown while the substrate temperature was kept at 500° C., the flow rate of DeZn was $83.89 \times 10^{-6}$ mol/min, and that of bis(cyclopentadienyl)magnesium $Mg(C_5H_5)_2$ was $3.4 \times 10^{-6}$ mol/min, oxygen was introduced at a flow rate of 300 sccm, and each material gas was supplied for 30 minutes.

The growth of light emitting layer 2 and the second clad layer 5 were performed following the same procedures as in Example 1, to prepare a light-emitting diode device 1.

EXAMPLE 7

Cleaning of a substrate 10 was performed using the same procedures as in Example 1, and zinc and oxygen precursors introduced to form a buffer layer 11 of intrinsic zinc-oxide of a few micrometers in thickness in order to eliminate impact of any defects in the substrate 10.

A first clad layer 4 was grown following the same procedures as in Example 6, to form a Ga-doped, n-type $Mg_{0.1}Zn_{0.9}O$ layer having a thickness of 2 µm.

After the first clad layer 4 was formed, a light-emitting layer 2 was grown as in Example 7, to form an n-type $Cd_{0.15}Zn_{0.85}O$ layer, doped with Ga at a concentration of $1 \times 10^{19}$ atoms/cm$^3$ having a thickness of 20 nanometers.

After the light-emitting layer 2 was formed, a second clad layer 5 was grown as in Example 3, to form a p-type $Mg_{0.1}Zn_{0.9}O$ layer doped with N at a concentration of $1 \times 10^{20}$ atoms/cm$^3$ having a thickness of 0.8 µm on the light-emitting layer 2.

The annealing treatment of the second clad layer 5 and fabrication of a diode device 1 from the wafer were performed following the same procedures as in Example 1, to prepare a blue light-emitting diode.

EXAMPLE 8

A light-emitting diode device 1 was prepared following the same procedures as in Example 7 except that, in the growth process of a light-emitting layer 2, the flow rate of TEGa was increased, to form an $Cd_{0.15}Zn_{0.85}O$ light-emitting layer 2 doped with gallium at a concentration of $1 \times 10^{22}$ atoms/cm$^3$.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A light-emitting zinc oxide-based compound semiconductor device having a double-heterostructure comprising:
    a light-emitting layer having first and second major surfaces and formed of a single layer of low-resistivity $Mg_{1-x-y}Cd_xZn_yO$; $0<x<1$, $0<y<1$, and x+y=0.1 to 1, compound semiconductor doped with an impurity;
    a first clad layer joined to said first major surface of said light-emitting layer and formed of an n-type zinc oxide-based compound semiconductor having a composition different from that of said compound semiconductor of said light-emitting layer; and
    a second clad layer joined to said second major surface of said light-emitting layer and formed of a low-resistivity p-type zinc oxide-based compound semiconductor having a composition different from that of said compound semiconductor of said light-emitting layer;
    a first contact layer joined to the first clad layer, the first contact layer composed of an n-type zinc oxide-based compound semiconductor having a higher concentration of n-type impurity than the first clad layer;
    a second contact layer joined to the second clad layer, the second contact layer composed of a p-type zinc oxide-based compound semiconductor having a higher concentration of p-type impurity than the second clad layer;
    a buffer layer composed of a zinc oxide layer and joined to the first contact layer, the buffer layer having relatively high crystallinity; and
    a substrate composed of zinc oxide joined to the buffer layer, the substrate sufficiently thick to provide structural support for the light-emitting layer, the first and second clad layers, the first and second contact layers and the buffer layer.

2. The device according to claim 1, wherein said first and second clad layers are represented by the formula $Mg_{1-x-y}Cd_xZn_yO$; $0 \leq x<1$, $0<y \leq 1$, and x+y=0.1 to 1.

3. The device according to claim 1, wherein said light-emitting layer has a thickness of 1 to 500 nanometers.

4. A light-emitting zinc-oxide-based compound semiconductor device having a double-heterostructure comprising:
    a light-emitting layer having first and second major surfaces and formed of a single layer of low-resistivity, p-type $Mg_{1-x-y}Cd_xZn_yO$; $0 \leq x<1$, $0<y \leq 1$, and x+y=0.1 to 1 compound semiconductor doped with a p-type impurity;
    a first clad layer joined to said first major surface of said light-emitting layer and formed of an n-type zinc-oxide-based compound semiconductor having a composition different from that of said compound semiconductor of said light-emitting layer; and
    a second clad layer joined to said second major surface of said light-emitting layer and formed of a low-resistivity p-type zinc oxide-based compound semiconductor having a composition different from that of said compound semiconductor of said light-emitting layer;
    a first contact layer joined to the first clad layer, the first contact layer composed of an n-type zinc oxide-based compound semiconductor having a higher concentration of n-type impurity than the first clad layer;
    a second contact layer joined to the second clad layer, the second contact layer composed of a p-type zinc oxide-based compound semiconductor having a higher concentration of p-type impurity than the second clad layer;

a buffer layer composed of a zinc oxide layer and joined to the first contact layer, the buffer layer having relatively high crystallinity; and a substrate composed of zinc oxide joined to the buffer layer, the substrate sufficiently thick to provide structural support for the light-emitting layer, the first and second clad layers, the first and second contact layers and the buffer layer.

5. The device according to claim 4, wherein said p-type impurity doped in said compound semiconductor of said light-emitting layer comprises at least one element selected from the group consisting of arsenic, nitrogen, phosphorus, or combinations of the foregoing.

6. The device according to claim 4, wherein said compound semiconductor of said first and second clad layer is represented by a formula: $Mg_{1-x-y}Cd_xZn_yO$; $0 \leq x < 1$, $0 < y \leq 1$, and x+y=0.1 to 1.

7. The device according to claim 4, wherein said compound semiconductor of said second clad layer is represented by a formula: $Mg_{1-n-m}Cd_nZn_mO$; $0 \leq n < 1$, $0 < m \leq 1$, and n+m=0.1 to 1.

8. The device according to claim 4, wherein said light-emitting layer has a thickness of 1 to 500 nanometers.

9. The device according to claim 4, wherein said p-type impurity doped in said compound semiconductor of said light-emitting layer comprises phosphorus, and a concentration of the phosphorus is $1 \times 10^{17}$ to $1 \times 10^{21}$ atoms per cubic centimeter.

10. The device according to claim 4, wherein said p-type impurity doped in said compound semiconductor of said second clad layer comprises nitrogen, and a concentration of the nitrogen is $1 \times 10^{17}$ to $1 \times 10^{21}$ atoms per cubic centimeter.

11. The device according to claim 4, wherein said second clad layer has a thickness of 1 to 500 nanometers.

12. The device according to claim 4, wherein said p-type impurity comprises a Group V element.

13. A light-emitting zinc oxide-based compound semiconductor device having a double-heterostructure comprising:

a light-emitting layer having first and second major surfaces and formed of a single layer of low-resistivity, n-type $Mg_{1-x-y}Cd_xZn_yO$; $0 \leq x < 1$, $0 < y \leq 1$, and x+y=0.1 to 1, compound semiconductor doped with an n-type impurity;

a first clad layer joined to said first major surface of said light-emitting layer and formed of an n-type zinc-oxide-based compound semiconductor having a composition different from that of said compound semiconductor of said light-emitting layer; and a second clad layer joined to said second major surface of said light-emitting layer and formed of a low-resistivity, p-type zinc-oxide-based compound semiconductor having a composition different from that of said compound semiconductor of said light-emitting layer;

a first contact layer joined to the first clad layer, the first contact layer composed of an n-type zinc oxide-based compound semiconductor having a higher concentration of n-type impurity than the first clad layer;

a second contact layer joined to the second clad layer, the second contact layer composed of a p-type zinc oxide-based compound semiconductor having a higher concentration of p-type impurity than the second clad layer;

a buffer layer composed of a zinc oxide layer and joined to the first contact layer, the buffer layer having relatively high crystallinity; and a substrate composed of zinc oxide joined to the buffer layer, the substrate sufficiently thick to provide structural support for the light-emitting layer, the first and second clad layers, the first and second contact layers and the buffer layer.

14. The device according to claim 13, wherein said n-type impurity doped in said compound semiconductor of said light-emitting layer comprises gallium or aluminum.

15. The device according to claim 13, wherein said n-type impurity doped in said compound semiconductor of said light-emitting layer comprises gallium, and a concentration of the gallium is $1 \times 10^{17}$ to $1 \times 10^{21}$ atoms per cubic centimeter.

16. The device according to claim 13, wherein said compound semiconductor of said first clad layer is represented by a formula: $Mg_{1-x-y}Cd_xZn_yO$; $0 \leq x < 1$, $0 < y \leq 1$, and x+y=0.1 to 1.

17. The device according to claim 13, wherein said compound semiconductor of said second clad layer is represented by a formula: $Mg_{1-n-m}Cd_nZn_mO$; $0 \leq n < 1$, $0 < m \leq 1$, and n+m=0.1 to 1.

18. The device according to claim 13, wherein said light-emitting layer has a thickness of 1 to 500 nanometers.

19. The device according to claim 13, wherein said compound semiconductor of said second clad layer is doped with a p-type impurity comprising phosphorus, and a concentration of the phosphorus is $1 \times 10^{17}$ to $1 \times 10^{21}$ atoms per cubic centimeter.

20. The device according to claim 13, wherein said second clad layer has a thickness of 50 to 1,500 nanometers.

21. The device according to claim 13, wherein said compound semiconductor of said light-emitting layer is of n-type, doped with at least a p-conductivity type impurity.

22. The device according to claim 13, wherein said n-type impurity comprises a group III element.

23. A light-emitting zinc-oxide-based compound semiconductor device having a double-heterostructure comprising:

a light-emitting layer having first and second major surfaces and formed of a single layer of low-resistivity, $Mg_{1-x-y}Cd_xZn_yO$; $0 \leq x < 1$, $0 < y \leq 1$, and x+y=0.1 to 1, compound semiconductor doped with p-type and n-type impurities;

a first clad layer joined to said first major surface of said light-emitting layer and formed of an n-type zinc-oxide-based compound semiconductor having a composition different from that of said compound semiconductor of said light-emitting layer; and a second clad layer joined to said second major surface and formed of a low-resistivity, p-type zinc-oxide-based compound semiconductor having a composition different from that of said compound semiconductor of said light-emitting layer;

a first contact layer joined to the first clad layer, the first contact layer composed of an n-type zinc oxide-based compound semiconductor having a higher concentration of n-type impurity than the first clad layer;

a second contact layer joined to the second clad layer, the second contact layer composed of a p-type zinc oxide-based compound semiconductor having a higher concentration of p-type impurity than the second clad layer;

a buffer layer composed of a zinc oxide layer and joined to the first contact layer, the buffer layer having relatively high crystallinity; and a substrate composed of zinc oxide joined to the buffer layer, the substrate sufficiently thick to provide structural support far the light-emitting layer, the first and second clad layers, the first and second contact layers and the buffer layer.

24. The device according to claim 23, wherein said compound semiconductor of said light-emitting layer has an electron carrier concentration of $1\times10^{17}$ to $5\times10^{21}$ atoms per cubic centimeter.

25. The device according to claim 23, wherein said p-type impurity doped in said compound semiconductor of said light-emitting layer comprises nitrogen, and said n-type impurity comprises gallium.

26. The device according to claim 23, wherein said p-type impurity doped in said compound semiconductor of said light-emitting layer comprises at least one element selected from the group consisting of phosphorus, nitrogen, arsenic, or combinations of the foregoing.

27. The device according to claim 23, wherein said n-type impurity doped in said compound semiconductor of said light-emitting layer comprises at least one element selected from the group consisting of aluminum, gallium, or combinations of the foregoing.

28. The device according to claim 23, wherein said compound semiconductor of said first clad layer is represented by a formula: $Mg_{1-x-y}Cd_xZn_yO$; $0\leq x<1$, $0<y\leq 1$, and $x+y=0.1$ to 1.

29. The device according to claim 23, wherein said compound semiconductor of said second clad layer is represented by a formula: $Mg_{1-n-m}Cd_nZn_mO$; $0\leq n<1$, $0<m\leq 1$, and $n+m=0.1$ to 1.

30. The device according to claim 23, wherein $0<x<0.5$.

31. The device according to claim 23, wherein said impurity doped in said compound semiconductor of said light-emitting layer comprises a p-type impurity including a Group V element and an n-type impurity including a Group III element.

* * * * *